United States Patent [19]
Bakke et al.

[11] Patent Number: 4,652,813
[45] Date of Patent: Mar. 24, 1987

[54] APPARATUS FOR IDENTIFYING WIRES OF MULTIPLE WIRE ELECTRICAL SYSTEM

[76] Inventors: John S. Bakke; David C. Bakke, both of 1247 Lorelei Ct., Campbell, Calif. 95008

[21] Appl. No.: 843,884

[22] Filed: Mar. 25, 1986

Related U.S. Application Data

[63] Continuation of Ser. No. 555,802, Nov. 28, 1983, Pat. No. 4,578,636.

[51] Int. Cl.$^4$ ............................................. G01R 19/00
[52] U.S. Cl. .......................................... 324/66; 324/51
[58] Field of Search ................................... 324/66, 51; 179/175.3 A

[56] References Cited

U.S. PATENT DOCUMENTS

| | | | |
|---|---|---|---|
| 2,666,898 | 1/1954 | Meldal | 324/66 |
| 2,822,519 | 2/1958 | Murphy | 324/66 |
| 3,054,949 | 9/1962 | Bates et al. | 324/66 |
| 3,728,616 | 4/1973 | Cheek et al. | 324/66 X |
| 3,982,180 | 9/1976 | Vaiden | 324/66 X |
| 4,130,794 | 12/1978 | Cox | 324/66 X |

FOREIGN PATENT DOCUMENTS

| | | | |
|---|---|---|---|
| 0270136 | 7/1913 | Fed. Rep. of Germany | 324/66 |
| 3012620 | 10/1981 | Fed. Rep. of Germany | 324/66 |
| 0709737 | 6/1954 | United Kingdom | 324/66 |
| 0924432 | 4/1963 | United Kingdom | 324/66 |

*Primary Examiner*—Stanley T. Krawczewicz
*Attorney, Agent, or Firm*—Townsend & Townsend

[57] ABSTRACT

For use with a wiring system having a plurality of wires, a control device having a detector having a plurality of actuatable, observable parts which are numbered, and an electrical circuit coupled with the detector for actuating a specific numbered part thereof when a lead of the circuit is coupled to a particular wire. The apparatus is essentially suitable for use in wiring system in which a plurality of wires extend from respective remote stations to a central station. In one embodiment, numbered resistance modules are coupled to the wires at respective remote locations to assign numbers to the wires, and the control device is at the central station for identifying the wires at the central station by successive actuation of the numbered parts of the detector unit. In a second embodiment, a resistance block is coupled to the wires at the central station to assign numbers to the wires, and the control device is used at the remote stations to identify the wires at such remote stations. The detector unit can include a group of light emitting diodes or a liquid crystal display.

11 Claims, 10 Drawing Figures

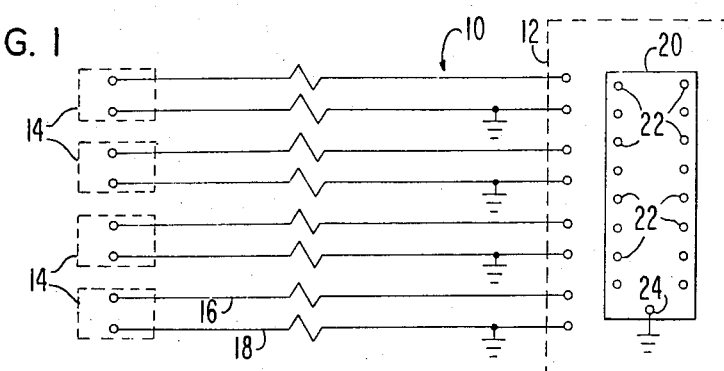
FIG. 1
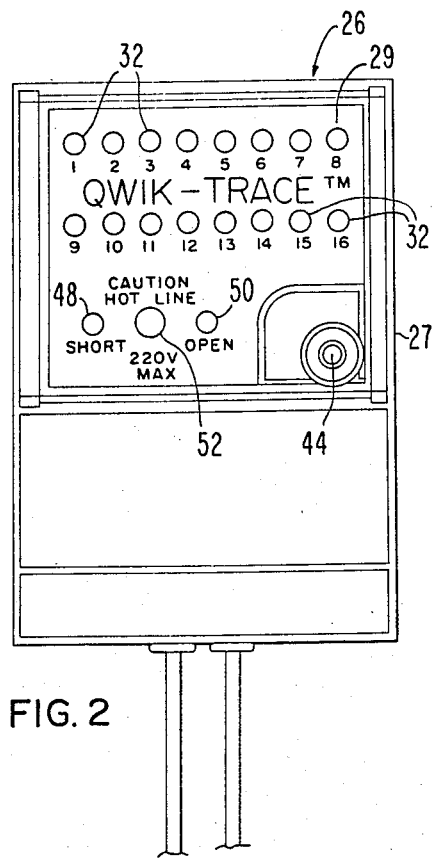
FIG. 2
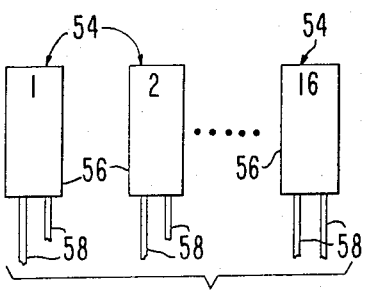
FIG. 3
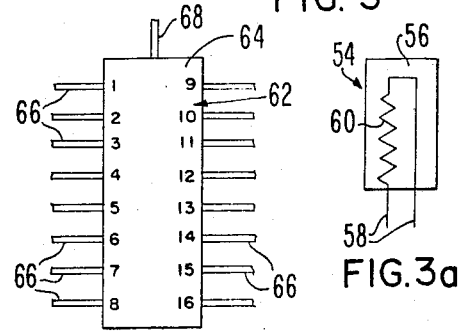
FIG. 4
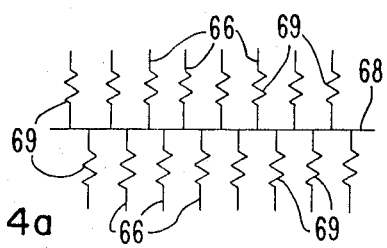
FIG. 3a
FIG. 4a

APPARATUS FOR IDENTIFYING WIRES OF MULTIPLE WIRE ELECTRICAL SYSTEM

This is a continuation of application Ser. No. 555,802 filed Nov. 28, 1983, now U.S. Pat. No. 4,578,636.

BACKGROUND OF THE INVENTION

1. Field of the Invention

This invention relates to improvements in the tracing and identifying of a plurality of wires of a wiring system extending from a central station to a number of remote stations spaced relatively far from the central station and from each other.

2. Description of the Prior Art

Many electrical wiring systems include multiple wires extending from a central control station to a number of remote field stations which are at long distances away from the central station. Typical wiring systems of this type include telephone systems, irrigation systems, traffic light control systems, truck and trailer wiring systems, burglar and smoke alarm systems and others.

To connect electrical equipment at the central station to individual electrical devices at the remote station becomes a time-consuming, tedious procedure, usually requiring two or more people and several hours or more of effort. For instance, in connecting solenoid-actuated valves at remote locations to a central timer, it is generally necessary or at least desirable to have the valves actuated in a predetermined sequence.

To eliminate the problems associated with the use of two or more people at opposite ends of the wires of a wiring system and to reduce installation costs, a need has continued to exist for an improved apparatus for tracing and identifying the wires as they extend over long distances from a central station to a plurality of remote stations. The present invention satisfies the aforesaid need as described hereinafter.

SUMMARY OF THE INVENTION

The present invention includes a control device which can be hand carried and is provided with its own power source. The control device has a panel provided with a detector which, for purposes of illustration, includes a plurality of light emitting diodes or a liquid crystal display, the detector having a circuit which includes a switching network capable of operating in conjunction with a resistance network. In one embodiment of the apparatus, a first type of resistance means is used to assign numbers to wires at a central location and the control device is used to identify the wires at a plurality of remote stations. In a second embodiment of the apparatus, a second type of resistance means is used to assign specific wire numbers at remote stations and the control device is used at the central station to identify the same wires. In either case, once the wires have been identified, they can be numbered for permanent identification.

The apparatus of the present invention is simple and rugged in construction, can be operated with no special skills on the part of the user, can be used by only a single person in a relatively short period of time so as to minimize the cost of tracing, identifying and marking a plurality of wires in a multiple wire electrical system.

The primary object of this invention is to provide an improved apparatus for identifying a plurality of wires in a multiple wire electrical system in which wires extend from a central station to a number of remote stations wherein the apparatus can be used to identify the wires at the remote stations after numbers have been assigned to the wires at the central station or the apparatus can be used at the central station after numbers have been assigned to the wires at the remote stations, either of which can be accomplished by a single person in a minimum of time so as to minimize the cost of tracing and identifying the wires even though the wires extend over long distances between the central and remote stations.

Other objects of this invention will become apparent as the following specification progresses, reference being had to the accompanying drawings for an illustration of the invention.

IN THE DRAWINGS

FIG. 1 is a schematic view of a typical wiring system having multiple wires extending over long distances from a central station to remote stations, with the wires being readily traceable with the apparatus of the present invention;

FIG. 2 is a front elevational view of a control device, light emitting diodes for use in tracing and identifying the wires of the wiring system of FIG. 1;

FIG. 3 is a side elevational view of a group of field modules usable in assigning numbers to the wires at the remote stations of FIG. 1;

FIG. 3a is a schematic view of a module of the type shown in FIG. 3;

FIG. 4 is a side elevational view of a resistor block used with the device of FIG. 2 to assign numbers to the wires at the central station;

FIG. 4a is a schematic view of the resistor block of FIG. 4;

DETAILED DESCRIPTION OF THE PREFERRED EMBODIMENT

Figure 5:
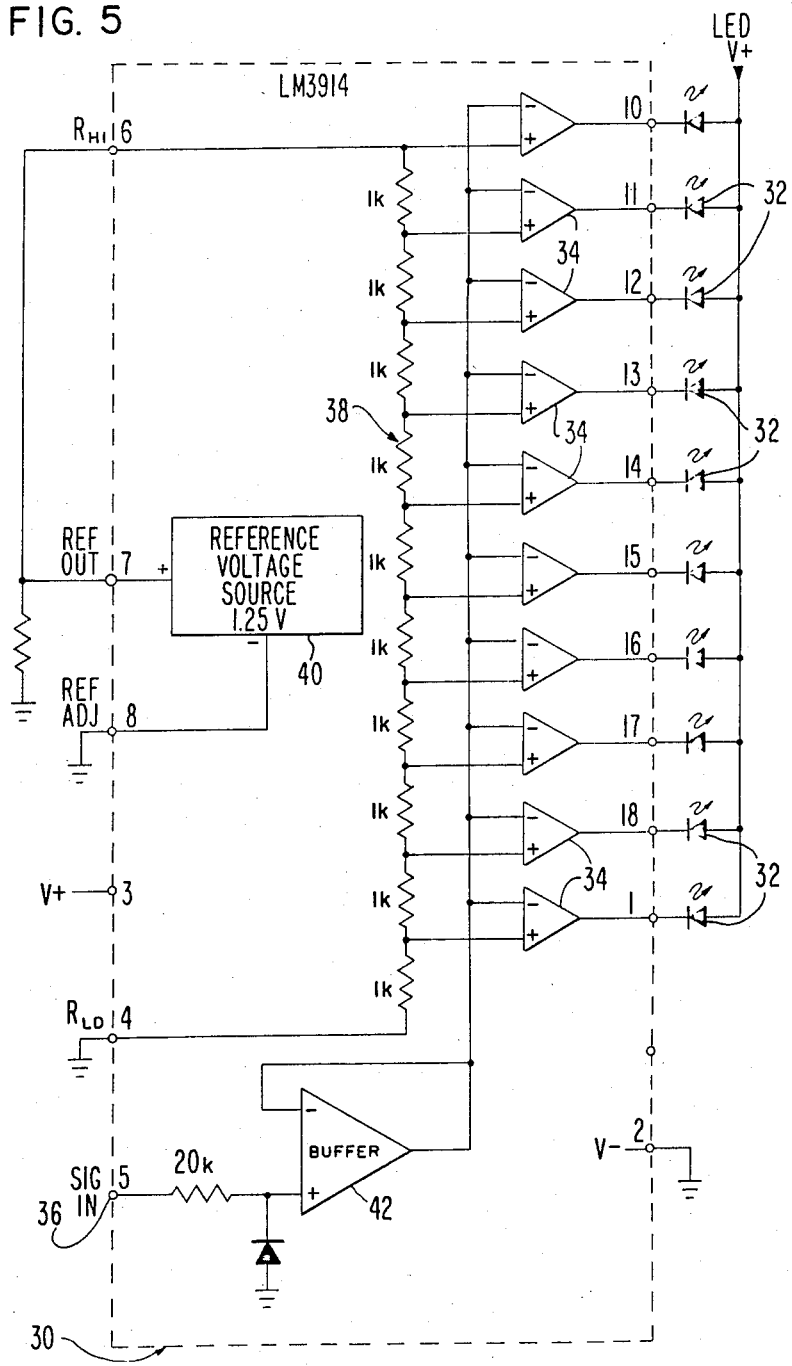
FIG. 5 is a schematic view of an electrical circuit including a switch network for use in selectively actuating the light emitting diodes on the device of FIG. 2.

The apparatus of the present invention is adapted for use with a multiple-wire wiring system 10 which includes a central or master control station 12 and a plurality of remote stations 14 which are located at relatively large distances away from central station 12, remote stations 14 being separated from each other by distances which can be relatively long or relatively short. Each remote location 14 has a pair of wires 16 and 18 which extend to the central station 12, wire 18 typically being a ground wire but either wire can be grounded, if desired. The pair of wires 16 and 18 are adapted to be coupled to an electrical device at the central station 12. For purposes of illustration, a timer 20 is located at central station 12. The timer has a plurality of terminals 22 and a common terminal 24, each terminal 22 and terminal 24 adapted to be coupled to the wires 16 and 18 of a respective remote station 14.

With the use of the apparatus of the present invention, it is possible to trace and identify the wires 16 and 18 such that the wires can be readily coupled to timer device 20 to perform a certain function. This can be accomplished after numbers have been assigned to the wires either at the remote stations or at the central station. Again, for purposes of illustration, wiring system 10 is adapted for use with an irrigation system wherein a plurality of solenoid actuated valves are adapted to be placed at respective remote stations 14 and coupled to respective wires 16 and 18 for actuation in accordance with the operation of timer 20 in a predetermined sequence.

The apparatus of the present invention includes a master control device 26 having a housing 27 for containing an electronic circuit 30 (FIG. 5) which is a switching network for selectively energizing any one of a plurality of light emitting diodes denoted by the numeral 32. For purposes of illustration, there are 16 light emitting diodes 32 mounted on a panel 29 and the diodes are numbered 1 through 16 to represent 16 remote stations 14. Also, for purposes of illustration, circuit 30 is an electronic device made by National Semiconductor Corporation and described and illustrated in a publication by National Semiconductor Corporation, entitled, "LM3914 Dot/Bar Display Driver, September 1981". As shown in FIG. 5, a plurality of light emitting diodes 32 are coupled to the outputs of a plurality of comparators 34 having a common input through a buffer 42 from a signal input 36 and a voltage divider 38 operated by a reference voltage source 40. The buffer 42 coupled with the signal input 36 drives the comparators 34 referenced to the voltage divider 38 so that, depending upon the voltage of the input signal at input 36, a particular light emitting diode 32 will be energized.

Figure 6:
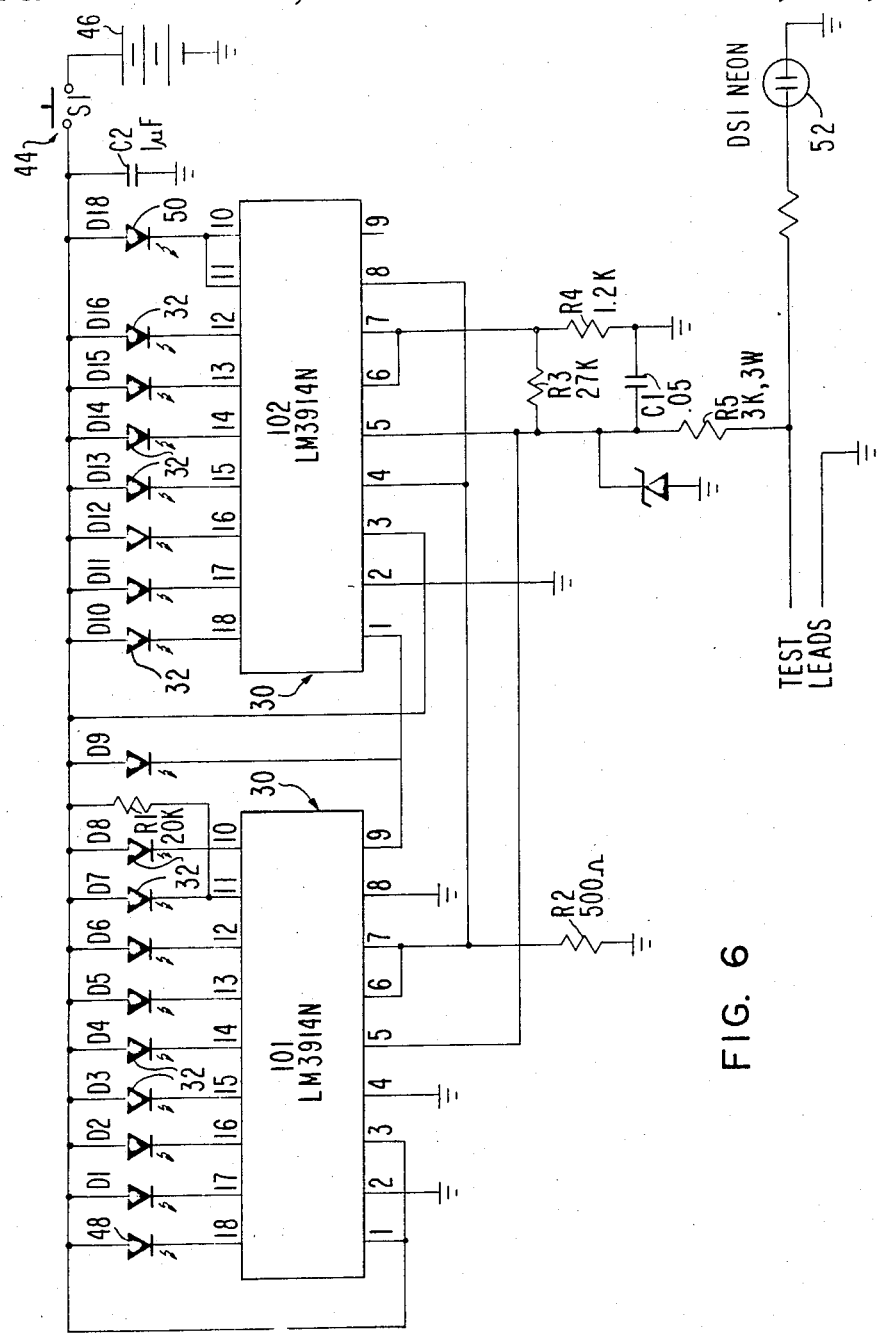
FIG. 6 is a view similar to FIG. 5, but showing a schematic view of the device of FIG. 2.

For a total of 16 remote locations 14, a pair of circuits 30 are used as shown in FIG. 6. The circuits 30 have respective light emitting diodes 32 corresponding to respective remote stations 14. Each diode 32 is assigned a certain number to distinguish it from the other diodes 32. Moreover, a push button switch 44 coupled to a voltage source 46 in housing 27 provides the power for operating circuits 30; thus, control device 26 is self-contained and needs no external source of electrical power.

A pair of light emitting diodes 48 and 50, respectively, indicate a short circuit and an open circuit when using device 26. These light emitting diodes are shown in FIG. 2 on opposite sides of a neon bulb 52 which provides a warning light to indicate when external power is on lines 16 and 18 during a test procedure. Thus, when light 52 is energized, it will warn that further testing should be interrupted until the external power has been removed from lines 16 and 18.

A plurality of numbered field modules 54 are used with device 26 when it is desired to assign specific numbers to wires 16 at respective remote locations 14. Each module 54 includes a tubular member 56 having a pair of leads 58 projecting outwardly therefrom. Schematically, each module 56 has a resistor 60 therewithin as shown in FIG. 3a, the resistance of each module 54 being different from the resistance of the other modules 54. Typically, for modules numbered 1, 2, 3 . . . 16, the resistances will progressively increase.

A resistor block 62 (FIG. 4) is used with device 26 to assign numbers to wires 16 at central station 12. Block 62 includes a housing 64 having a plurality of numbered leads 66 extending outwardly therefrom. A common lead 68 projects outwardly from end of the housing 64. Schematically, the resistor block 62 is shown in FIG. 4a with each lead 66 being coupled to one end of a resistor whose opposite end is coupled to the common line 68. The resistances of resistors 69 are all different from each other and progressively increase typically from resistor numbered 1 to resistor numbered 16.

Figure 7:
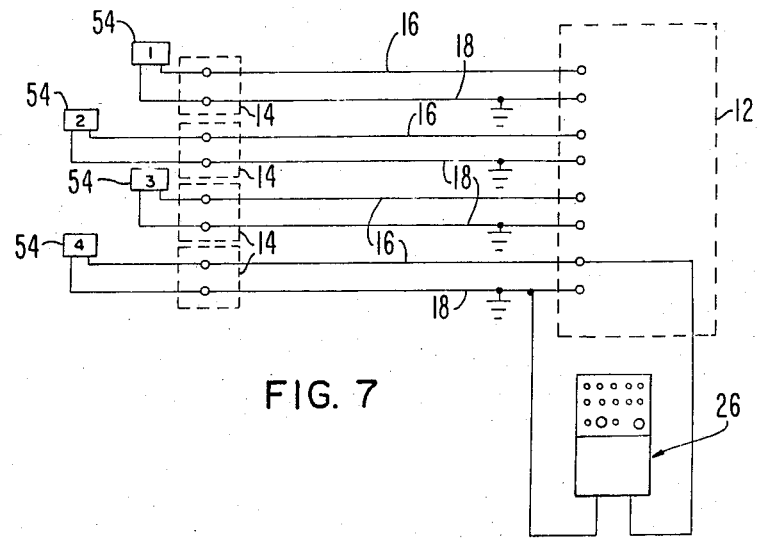
FIG. 7 is a view similar to FIG. 1, but showing the way in which the device of FIG. 2 and the modules of FIG. 3 are coupled with the wiring system of FIG. 1 to trace and identify the wires of the wiring system.
Figure 8:
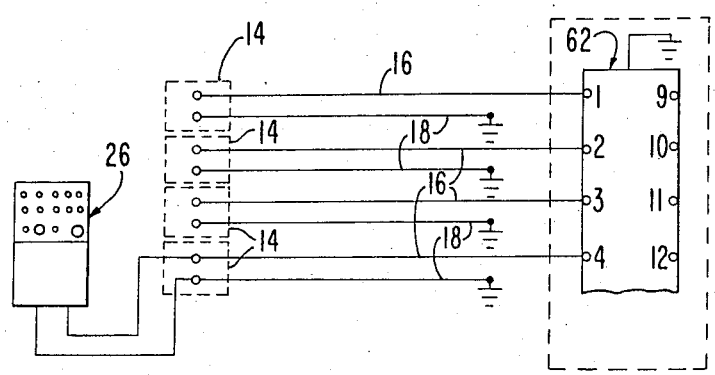
FIG. 8 is a view similar to FIG. 7, but showing the way in which the wires are traced by using the resistor block of FIG. 4.

FIG. 7 illustrates the way in which device 26 is used with modules 54 to identify wires at central station 12 after wire numbers have been assigned at remote stations 14. FIG. 8 shows the way in which device 26 is used with resistor block 62 to identify wires at remote stations 14 after wire numbers have been assigned at central station 12. The modules 54 of FIG. 3 are used in FIG. 7 and the specific numbers on the modules are assigned to wires 16 and 18 at remote stations 14. The resistor block 62 is used in FIG. 8 and the specific numbers on leads 66 of block 62 are assigned to wires 16 and 18 at central station 12. After the numbers have been assigned, labels with numbers are placed on the wires. In the alternative, numbers can be written on the wires with a felt pen.

With respect to FIG. 7, it is first desired to assign numbers to wires 16 at remote stations 12 using the individual, pre-numbered field modules 54. The first step in using modules 54 is to couple the leads 58 of each module 54 with the leads 16 and 18 at a respective remote station 14. With all of the modules so coupled together, the user will then go to central station 20 and, by using control device 26, will be able to identify the corresponding ends of the wires 16 at station 20 for connection with timer 20 or other electrical control device at the central station.

At central station 12, the first step in identifying the wires is to connect the common lead of device 26 to either wire 16 or 18 of a station 14. Then, the other test lead of device 26 is connected to or put into contact with the other wire 16 or 18. Then control switch 44 is actuated and a particular light emitting diode will light up, such light emitting diode being the one corresponding the number of the module at the corresponding remote location 14. Each pair of wires 16 and 18 then can be marked with the proper number and can be connected directly to the proper terminal 22 on timer 20. This step is repeated until all wires 16 at station 12 are marked with the appropriate number corresponding to the number of the module at the remote location or until the wires 16 are all coupled to appropriate terminals 22 on timer 20. Then, the user returns to the remote locations and removes the field modules 54. Generally, for connecting solenoid valves to the wires at the remote locations 14, it is recommended that the solenoid valves be connected at the location as the field modules are removed.

Device 26 operates to energize a particular light emitting diode for each module 54 because the resistance of the module changes the signal voltage applied to circuit 30. As it changes, the signal is compared with a series of voltages which are applied by voltage divider 38 (FIG. 5) to the inputs of comparators 34. When the signal voltage applied to the input of circuit 30 matches one of the voltages applied by the voltage divider, a particular comparator 34 will have an output voltage which will energize a particular light emitting diode 32. Thus, the resistances of the modules 54 will be selected to cause actuation of particular light emitting diodes for identifying the wires 16 and 18.

With reference to FIG. 8, this arrangement is used when numbers are to be assigned to wires 16 and 18 at central station 20 and the wires 16 are to be identified at remote locations 20. The first step in using this approach is to couple the common lead 68 of resistor block 62 to the common terminal 24 of timer 20 or to one of the wires 16 and 18 of each wire pair. Then, the numbered leads 66 on resistor block 62 are coupled to other wires of the wire pairs and the numbers on leads 66 will thereby be assigned to the wires. Each wire coupled with a lead 66 is labeled with the number that appears on the resistor block 62 to which it is connected.

The user then takes the control device 26 to the first remote location 14 and connects the common lead of device 26 and the remaining lead to the other wires in sequence. Switch 44 on device 26 is then actuated to indicate the numbered light emitting diode that will be actuated or will light up. The number of the light emitting diode which is actuated is the number corresponding to the resistor block number. The wire at the remote location is then provided with a number with a suitable label. The remaining wire pairs 16 and 18 are then probed and then numbered, following which all wires will have been identified and numbered with the proper marking.

The apparatus of the present invention is also suitable for checking circuit continuity before the above tests are conducted. For instance, to test for an open circuit, the open light emitting diode 50 will be energized if there is an open circuit in the circuitry of device 26 as shown in FIG. 6. Open circuits will occur when device 26 is not properly connected to wires 16 and 18 or if the leads of modules 54 or the leads of resistor block 62 are not properly connected. An open circuit will also occur when the common is not properly established or if the wire is broken or not connected. To test for an open circuit, it is desirable to first check the connections from device 26 and resistor block 62. After checking the resistor block connections at central station 12, then the opposite end of wire 16 and 18 is tested. If the open light emitting diode 50 is energized or lights up, there is a broken or unconnected wire when improper common connection.

To test for short circuits, the shorting light emitting diode will be energized if there is a short circuit (two wires touching) or if there is a low resistance in the circuit such as a low resistance solenoid or some other low resistance low already hooked to the circuit. In wiring for irrigation purposes, all solenoids should be disconnected when testing.

The light emitting diodes 32 define a detector unit along with comparators 34. Other means could be used to define a detector unit, such as liquid crystal display.

We claim:

1. Apparatus for identifying a plurality of wires of a multiple wire electrical system having first ends at a central station and second ends at respective remote stations comprising:
    a plurality of means for producing a first voltage level, each means for producing a first voltage level being removably connectible to the second end of one of said wires and a common wire with each of the means for producing a first voltage level being adapted to provide a different voltage level; and
    a control device having a pair of leads for removable connection with the first end of each wire and said common wire, said device including an electrical circuit having a plurality of comparators, each comparator having first and second signal inputs and a signal output, means for applying a different, second voltage level to each of said first signal inputs of said comparators, coupling means for applying a signal on said first end of one of said wires to one of said second signal input of said comparators, said circuit further including an observable indicator means, coupled to at least one of said comparator signal outputs, for identifying one of said wires.

2. The apparatus of claim 1 wherein said means for applying a different, second voltage level comprises a voltage divider.

3. The apparatus of claim 2 wherein said voltage divider comprises a series of resistances.

4. The apparatus of claim 1 wherein each of said means for producing a first voltage level comprises a resistance, with each resistance having a different value.

5. The apparatus of claim 1 wherein each of said plurality of means for producing a first voltage level comprises a single network with a first lead of each of said means for producing a first voltage level being coupled together.

6. The apparatus of claim 5 wherein each of said means for producing a first voltage level source comprises a resistance, with each resistance having a different value.

7. The apparatus of claim 1 wherein said indicator means includes at least one light emitting diode.

8. The apparatus of claim 1 wherein said indicator means comprises a liquid crystal display.

9. The apparatus of claim 1 further comprising a pair of indicators coupled to said electrical circuit for indicating an electrical short or an electrical open, respectively, in said wires.

10. The apparatus of claim 1 further comprising means for actuating said electrical circuit.

11. The apparatus of claim 1 further comprising an electrical power supply.

* * * * *